United States Patent
Gordin

(10) Patent No.: US 9,028,115 B1
(45) Date of Patent: May 12, 2015

(54) APPARATUS, METHOD, AND SYSTEM FOR LIGHTING FIXTURE COOLING

(71) Applicant: Musco Corporation, Oskaloosa, IA (US)

(72) Inventor: Myron Gordin, Oskaloosa, IA (US)

(73) Assignee: Musco Corporation, Oskaloosa, IA (US)

( * ) Notice: Subject to any disclaimer, the term of this patent is extended or adjusted under 35 U.S.C. 154(b) by 0 days.

(21) Appl. No.: 13/791,941

(22) Filed: Mar. 9, 2013

Related U.S. Application Data

(60) Provisional application No. 61/645,870, filed on May 11, 2012.

(51) Int. Cl.
| | |
|---|---|
| *B60Q 1/06* | (2006.01) |
| *F21V 15/00* | (2006.01) |
| *F21V 29/02* | (2006.01) |
| *F21V 29/00* | (2006.01) |
| *G06F 17/50* | (2006.01) |

(52) U.S. Cl.
CPC .............. *F21V 29/025* (2013.01); *F21V 29/22* (2013.01); *G06F 17/50* (2013.01)

(58) Field of Classification Search
None
See application file for complete search history.

(56) References Cited

U.S. PATENT DOCUMENTS

| | | | | |
|---|---|---|---|---|
| 7,684,665 B2 * | 3/2010 | Jasmin et al. | ................... | 385/33 |
| 8,449,144 B2 | 5/2013 | Boxler et al. | | |
| 2011/0149582 A1 | 6/2011 | McKee | | |
| 2013/0250556 A1* | 9/2013 | Gordin et al. | ................. | 362/147 |
| 2014/0092593 A1* | 4/2014 | Gordin et al. | ................. | 362/232 |

FOREIGN PATENT DOCUMENTS

| | | |
|---|---|---|
| WO | WO 91/11024 A1 | 7/1991 |
| WO | WO 03/096387 A2 | 11/2003 |
| WO | WO 2005/043598 A2 | 5/2005 |
| WO | WO 2006/114726 A2 | 11/2006 |
| WO | WO 2007/044472 A2 | 4/2007 |
| WO | WO 2008/032251 A1 | 3/2008 |

OTHER PUBLICATIONS

AEGIS Intelligent-IR, Derwent Systems Ltd., 2007, brochure.
Artic Cooling Freezer 7 Pro Rev.2 92mm Fluid Dynamic CPU Cooler, 2 pages, http://www.newegg.com/Product/Product.aspx?Item=N82E16835186134, [retrieved from Internet on Oct. 19, 2011].

(Continued)

*Primary Examiner* — Natalie Walford
(74) *Attorney, Agent, or Firm* — McKee, Voorhees & Sease

(57) ABSTRACT

A high-intensity LED lighting system is presented whereby one or more LED lighting fixtures are affixed to an elevating structure, the elevating structure having a substantially continuous internal pathway. Said pathway can be used as a conduit or duct for pressurized air which is introduced at or near the bottom of the elevating structure and forced upwardly toward the lighting fixtures so to provide cooling of one or more components of the lighting fixtures so to, ultimately, improve the efficacy of the LEDs contained therein. A method of designing lighting systems, including analysis of whether or not to add air cooling to increase light source efficiency is also disclosed.

24 Claims, 5 Drawing Sheets

(56) References Cited

OTHER PUBLICATIONS

Bush, Steve, "Lumileds Talks LED Packaging—Interview", Electronicsweekly.com, Retrieved Oct. 14, 2008 from http://www.electronicsweekly.com/Articles/2008/03/26/43394/lumileds-talks-led-packagin-interview.htm [retrieved from Internet on Oct. 14, 2008].

Ellsworth Jr., Michael and Simons, Robert, "High Powered Chip Cooling—Air and Beyond, Electronics Cooling", http://www.electronics-cooling.com/articles/2005/2005_august_article1.php [Retrieved from Internet on Oct. 15, 2008].

Epoxies, Etc . . . , 20/3302 Water Clear Optically Transparent Epoxy datasheet.

Glynn, Colin and Murray, Darina, "Jet Impingement Cooling in Microscale", ECI International Conference on Heat Transfer and Fluid Flow in Microscale, Sep. 25, 2005.

Granet, Irving et al., "Thermodynamics and Heat Power", Seventh Edition, Pearson Prentice Hall, ISBN 0-13-110672-4, 1974, 8 pages.

Luxlink, "Optical Gel", Epoxy OG-1052 datasheet.

"Master Bond Application Selector Guide for Electro-Optic, Fiber-Optic Laser Applications", epoxy datasheet.

McMaye, Frank, "Electronic Packaging Characterization per JEDEC Standard, Electronics Cooling", http://www.electronics-cooling.com/articles/1997/jan/jan96_02.php [Retrieved from Internet on Jun. 24, 2009].

Olson, Chad, "Monitoring Heat Dissipation in Electronic Systems, Power Electronics", http://www.printthis.clickability.com/pt/cpt?expire=&title=Monitoring+Heat+Dissipation+In+Electronic+Systems+Page+of&url ID=18528715&action=cpt&partnerID=97651fb=Y&url=http%3A%2F%2Fpowerelectronics.com%2Fmag%2Fpower_monitoring_heat_dissipation%2Findex.html [Retrieved from Internet on Jun. 25, 2009].

Philips Solid-State Lighting Solutions, "Color Kinetics Source Life Information—LED Lifetime", http://www.colorkinetics.com/lifetime [Retrieved from Internet on Oct. 14, 2008].

Philips Lumileds Lighting Company, "Thermal Design Using Luxeon Power Light Sources", 2006, Application Brief AB05.

ScienceDaily, "Cooling in Miniature, Without Bulky Machines, Conventional Fluids or Moving Parts", http://www.sciencedaily.com/releases/1999/10/991027072853.htm, Cornell University. [Retrieved from Internet on Oct. 22, 2008].

Sofia, John, "Electrical Temperature Measurement Using Semiconductors, Electronics Cooling", http://www.electronics-cooling.com/articles/1997/jan/jan97_03.php [Retrieved from Internet on Jun. 24, 2009].

The Unico System, "Homeowner Product Information Guide", Brochure, www.unicosystem.com, (date unknown) 4 pages.

The Unico System, "2.5 Duct with Threaded Outlet", Brochure, (date unknown), 2 pages.

U.S. Department of Energy, "Lumen Depreciation", http://www.netl.doe.gov/SSL/usingLeds/general_illumination_life_depreciation.htm. [Retrieved from Internet on Oct. 14, 2008].

Gordin, Myron et al., "Solid-State Light Fixture With Cooling System With Heat Rejection Management" U.S. Appl. No. 12/623,875, filed Nov. 23, 2009.

Gordin, Myron et al., "Apparatus, Methods, and Systems for Cooling Lenses and/or Phosphors of LED or Other Solid State Lighting", U.S. Appl. No. 12/626,095, filed Nov. 25, 2009.

* cited by examiner

APPARATUS, METHOD, AND SYSTEM FOR LIGHTING FIXTURE COOLING

CROSS-REFERENCE TO RELATED APPLICATIONS

This application claims priority under 35 U.S.C. §119 to provisional U.S. application Ser. No. 61/645,870 filed May 11, 2012, herein incorporated by reference in its entirety.

BACKGROUND OF THE INVENTION

In the field of sports and wide-area lighting, manufacturers are attempting to find ways to make the use of light-emitting diodes (LEDs) competitive where high-intensity discharge (HID) lighting has traditionally been dominant. LEDs can be made more competitive by increasing their lumen output, improving efficacy (lumens per watt), increasing longevity, and reducing cost. Thus, any technology that has the potential to improve on one or more of these factors is desirable in the lighting industry.

Certain techniques for improving individual factors are well known in the industry; however, improving one factor may diminish other factors. For example, LEDs are typically rated for lumen output @ 25° C. and 350 mA. Increasing current increases lumen output, but lowers efficacy at the same temperature; still worse, when temperature increases as is typical with increased power input, efficacy and lumen output decrease.

Likewise, LEDs can have a much longer average life than other types of lighting (e.g., on the order of 50,000 hours versus 5,000 hours); however, average life is reduced significantly as the LEDs are operated at higher temperatures and currents. LED life can be reduced by one or two orders of magnitude by operating at higher currents and temperatures that are still considered to be within viable operating parameters (e.g., 1000 mA and 125° C.). This can reduce their usability for lighting applications requiring thousands of hours per year of ON time, but is not necessarily a liability for lower usage applications such as some types of sports lighting (which may require as little as 250 hours of ON time per year).

The cost for fixtures and support structures is a very significant part of LED lighting cost. Reducing the number of LEDs required per fixture to achieve a given light level on a target area can significantly lower overall costs; however, reduction of the number of LEDs requires increasing light output per LED, which results in reduced average life due to higher currents and operating temperatures.

Therefore, managing LED temperature is important to optimizing efficiency, efficacy, and cost. Thus, there is room for improvement in the art.

SUMMARY OF THE INVENTION

While the use of LEDs in wide-area or other lighting applications typically employing HID or other traditional light sources seems promising (e.g., due to the longevity of LEDs), one must consider an issue previously unaddressed (in many cases) for lighting systems using traditional light sources: heat management.

It is therefore a principle object, feature, advantage, or aspect of the present invention to improve over the state of the art and/or address problems, issues, or deficiencies in the art.

According to an aspect of the present invention, an elevating structure of a lighting system is utilized as a way to route pressurized air to high-intensity LED lighting fixtures elevated on that elevating structure. In one aspect, a continuous pathway that exists naturally in the interior of the elevating structure is taken advantage of as an air conduit or duct from a source of pressurized air traveling from well below the fixtures up to the fixtures. As one option, any mounting structures (such as cross arms), fixture mounting knuckles, and the like that have continuous internal pathways can also be taken advantage of by putting them in fluid communication with the pathway through the elevating structure.

Another aspect of the present invention relates to designing LED high-intensity lighting systems by determining the amount of and uniformity of illumination needed at a target area, determining potential placement of lighting fixtures relative the target area (including elevation and distance away), and determining a conventional set of LED lighting fixtures that will meet or exceed intensity and uniformity levels for the target area over a conventional or desired amount of normal operating life. Then, a determination will be made of whether or not the cost of an air cooling subsystem is justified. Some considerations include, but are not limited to, establishing a source of pressurized air mounted below the fixtures on an elevating structure, creating air pathways to the fixtures elevated on the structure, and capital and operating costs for such a subsystem over its normal operating life. In some instances, the elevating structure has original built-in continuous pathways that can be taken advantage of for airflow pathways from the pressurized source to the fixtures to eliminate the need for separate air conduits or ducts. A designer can evaluate capital costs and operation costs based on a certain airflow capacity relative to amount of additional efficacy of the fixtures for such air cooling, to determine such things as how much airflow capacity would be added, whether or not capital costs could be reduced by reducing the number of LEDs or even fixtures for a given application, and including in some instances whether entire elevating structures and fixtures could be eliminated by an increase in efficacy from air cooling.

One embodiment according to the present invention uses air cooling to reduce the temperature of wide-area lighting fixtures. A small blower or fan (e.g., on the order of ⅓ horsepower) is installed with its output directed into a hollow lighting support pole. Air distribution is through the pole and either coaxially through the fixture mounts, or through appropriate ducting from the pole to the fixtures. Air is directed through the fixtures or to the heat sink on the back side of fixtures. Power usage for the blower would be calculated and energy cost for the blower versus potential power savings for the fixtures compared, with optimum values calculated based on the needs of the project. For the example of model XP-G LEDs, available from Cree, Durham, N.C., USA, efficacy increases on the order of 10-15% should be achievable, resulting in cost savings of tens or hundreds of dollars. This method would ideally be applied to sports lighting applications, which typically have many high wattage fixtures mounted on each pole. This allows the cost of the blower and its energy draw to be allocated to many fixtures. Further, since increasing total light output per fixture is very beneficial for sports lighting, and since a major limiting factor in using LEDs in sports lighting is temperature rise due to increased power, significant cost savings might result. Conversely, for other wide-area lighting (e.g., parking lot lighting, street lighting, etc.), while the cost savings resulting from the increased energy efficiency attributed to air cooling might not in itself be enough to make air cooling economically advantageous, air cooling might increase expected LED life enough to make air cooling economically feasible as well.

These and other objects, features, advantages, or aspects of the present invention will become more apparent with reference to the accompanying specification and claims.

BRIEF DESCRIPTION OF THE DRAWINGS

From time-to-time in this description reference will be taken to the drawings which are identified by figure number and are summarized below.

DETAILED DESCRIPTION OF EXEMPLARY EMBODIMENTS

A. Background

Figure 1:
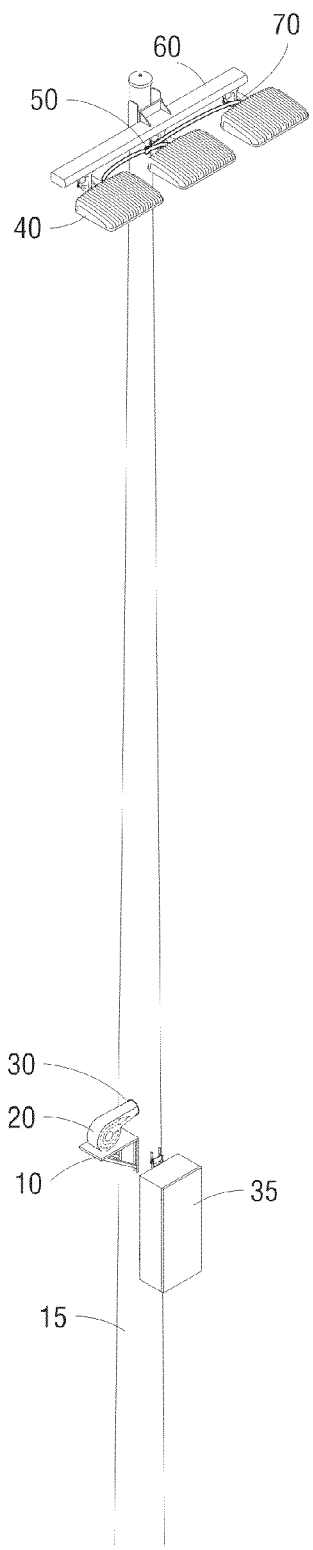
FIGS. 1, 2, 3A and B illustrate a cooling system for lighting fixtures according to a first exemplary embodiment of the invention.

As indicated above, the context of the invention relates to improvements in efficacy of high-intensity LED fixtures which are elevated for wide-area lighting; specifically, via air cooling of one or more components of the fixtures. It is to be understood that the following detailed description is to assist in a better understanding of the invention and its aspects. It is not intended to be exclusive or inclusive of all forms and embodiments the greater invention can take.

As envisioned, air cooling can reduce the operating temperature of LED fixtures down to near-ambient with a relatively simple apparatus. Such a cooling system may generally be described as including a small blower or fan, on the order of ⅓ horsepower, installed with its output directed into a hollow lighting support pole. Air distribution flows through the pole, through hollow cross arms, and through channels or pathways in the fixture mounts with the air being directed to the heat sink on the back side of the fixtures; the use of heat sinks to dissipate heat from LEDs is well known in the art. Power usage for the blower is calculated and the energy cost for the blower versus potential power savings for the fixtures compared, with optimum values calculated based on the needs of the project. Factors to consider when evaluating the benefit of such a system include, but are not limited to:

a. kW-hr cost of electricity;
b. efficacy versus temperature curve for LEDs;
c. cost for blower and controls;
d. costs for additional ducts and tubing, if required;
e. costs for air sealing any pole or fixture openings, if required; and/or
f. maintenance costs for blowing equipment.

Table 1 below illustrates test results from air cooling a 24-LED fixture of the type disclosed in U.S. published patent application 2010/0195326, now U.S. Pat. No. 8,449,144, incorporated by reference herein and commonly owned by the assignee of the present application. LEDs were model XP-G available from Cree, Durham, N.C., USA. The fixture was operated at near-constant power but, as can be seen, temperature declined with increased air speed. In these tests, air cooling was achieved by directing air at the approximate speeds indicated in Table 1 across the fixture. This air was generally enclosed and directed onto the heat sink (and not generally disbursed). Thus, it is believed that such airflow fairly uniformly impacted the entire fixture (as opposed to being simply focused on one localized part). As can be seen from Table 1, the percent lumen increase is not linear relative to air speed. This discovery can be beneficially used by designers in weighing the various and sometimes antagonistic factors between capital and operating costs of adding such a cooling system and light efficacy improvements or benefits for the lighting system.

TABLE 1

| Test | Power (W) | Temperature (° C.) | Air Speed (mph) | Lumens (lm) | Lumen Increase (%) |
|---|---|---|---|---|---|
| 1 | 222.5 | 123 | 0 | 13640 | (base) |
| 2 | 230.1 | 87 | 9.5 | 15822 | 16 |
| 3 | 238.6 | 82 | 18 | 16170 | 18.5 |

B. Exemplary Method and Apparatus Embodiment 1

In a first embodiment, pole 15, FIG. 1 elevates light fixtures 40 some distance in the air, on the order of (for example) 50 feet or more. One example of light fixtures 40 are model STR-LWY-15-HT available commercially from BetaLED, Sturtevant, Wis., USA. Another example of light fixtures 40 are those disclosed in U.S. patent application Ser. No. 12/626,095, incorporated by reference herein and commonly owned by the assignee of the present application. An example of pole 15 is model LSS50A available from Musco Sports Lighting, Oskaloosa, Iowa, USA, which is essentially a hollow galvanized steel tapered pole of either one piece or multiple slip-fit sections. Pole 15 presents a continuous air pathway from its bottom to top. A typical fifty foot tall pole of this nature has a largest outside diameter of approximately 10 inches at its bottom (approximately 79 square inches cross-sectional area), and approximately 6 inches smallest outside diameter at its top (approximately 28 inches square cross-sectional area). Whether one piece or several slip-fit sections, pole 15 is substantially air tight. It would represent an overall interior volume of approximately 27,000 cubic inches. There may be handles or other openings for the introduction of electrical wirings that could also occupy some of the interior volume of the pole. As mentioned, said openings can be substantially sealed off, or at least sealed or blocked enough that at a pressurization or airflow level selected, airflow would not be significantly diverted from being delivered up to the light fixtures for cooling. Pole 15 is hollow, but essentially sealed. With this particular pole, the bottom of the metal, tubular pole is slip-fit for several feet over a mating concrete stub to support the pole in a vertical position. Thus, several feet of the bottom of the pole would be occupied by that interference-fit concrete stub. Additionally, the top of such a pole would normally have a cap and/or could have what is called a pole top fitter. A pole top fitter could comprise a hollow tubular section to which cross arms and a top closing cap can be slip-fit, with the fitter slip-fit on the top tapered end of the main pole. In any case, introduction of pressurized air into the pole and routing up through the pole to a location at or near the fixtures would take into account such features.

Figure 2:
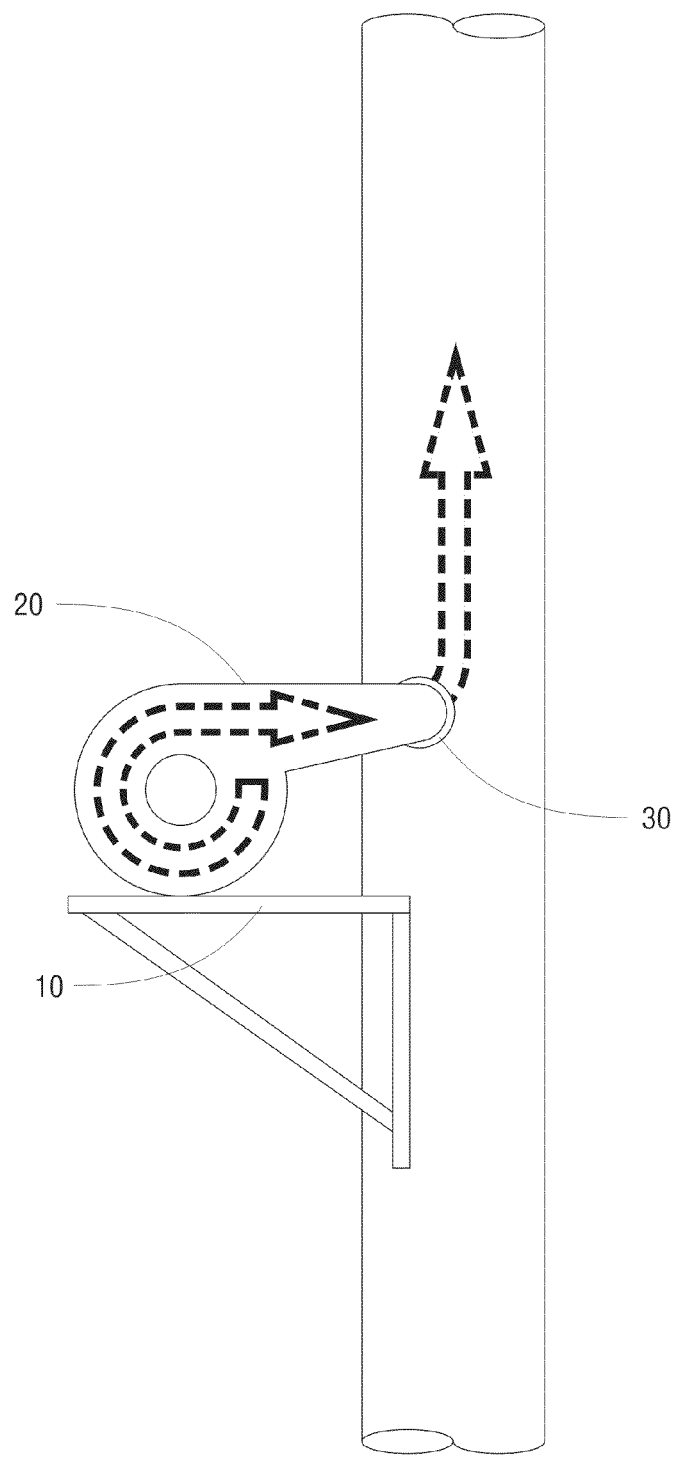
Figure 4:
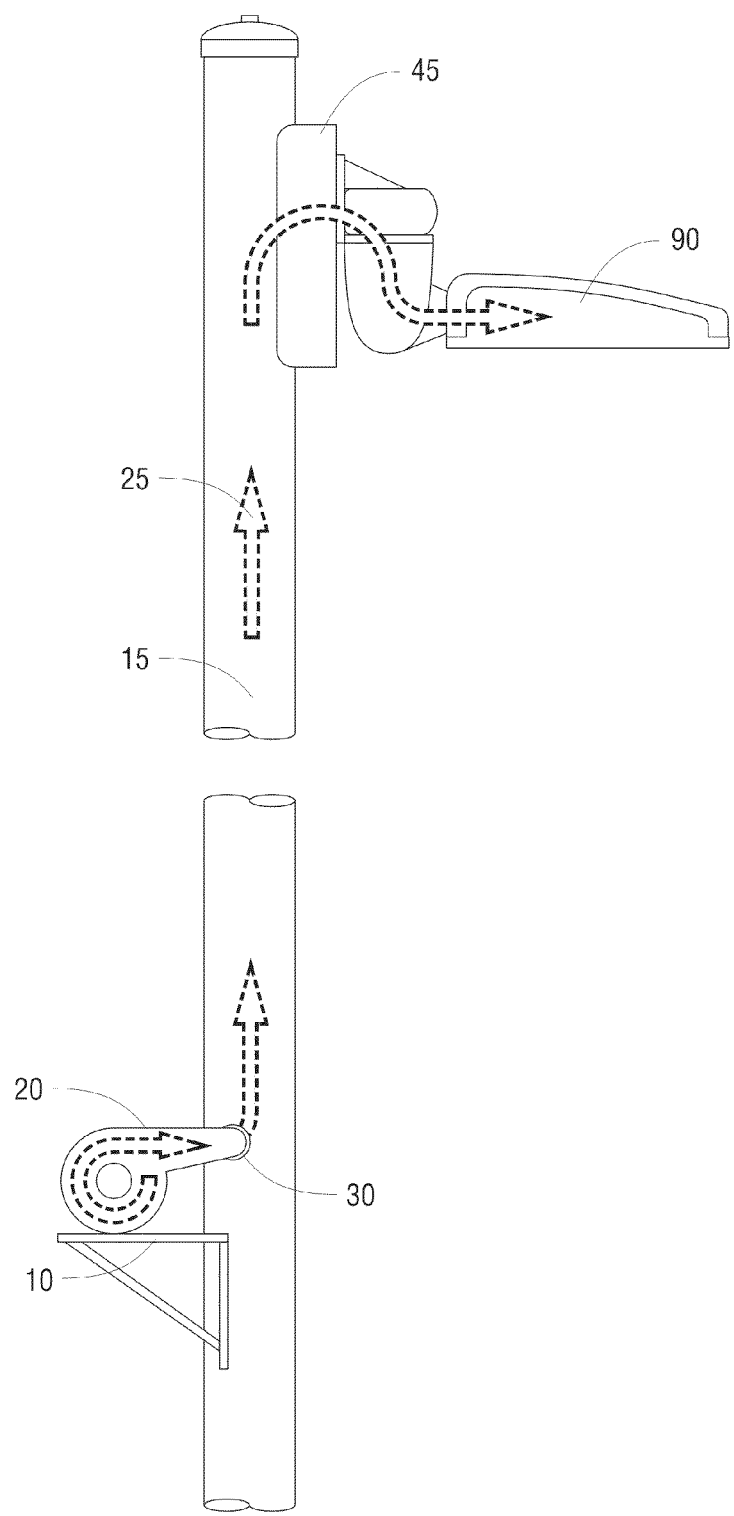
FIG. 4 illustrates an alternative exemplary embodiment according to aspects of the invention.

Blower or fan 20 is installed on the pole, with the outlet of the blower directed into an opening 30 in pole 15. As indicated in FIGS. 1, 2, and 4, blower 20 could be mounted at or near pole 15 along its length such that its output is introduced into the hollow interior of pole 15. In the illustrated examples, a separate mounting platform or structure 10, FIG. 1 can first be attached by appropriate fastening devices along the pole at the appropriate location. Blower 20 would then be mounted or supported on that platform. An appropriate opening into pole 15 would be formed and the intersection of the blower and pole at least substantially sealed by any of a variety of appropriate means. Alternatively, blower 20 might have mounting hardware to mount it to pole 15, or otherwise sufficiently be supported at its interface with pole 15 so to no longer require a separate platform. As can be appreciated by those skilled in the art, the type and operation of blower 20 can vary according to desire and need. Factors could include the amount of airflow and speed delivered to the fixtures suspended at or near the top of pole 15. Factors could further include the internal volume defined by pole 15 and any subsequent conduits to fixtures 40, the leakiness or lack thereof of air (caused by, for example, other items attached along the pole, pole joints, joints between such things as cross arms and fixture mounts, etc.), whether other components occupy the interior space of pole 15, and the like. In this embodiment, one example of blower 20 is described below. Any other openings into pole 15 may be sealed, or may present a small enough air leak such that it does not matter to the desired cooling function.

As indicated in Table 1, the designer can select a blower output capacity by referring to a derived empirical relationship between air speed relative to percent lumen increase. For example, substantial leakiness in the air pathway from blower 20 to fixtures 40 may result in a substantial drop in air speed as measured at the fixtures. But, as indicated at Table 1, even a substantial drop between the two can result in a substantial percent lumen increase if enough air speed can be generated at the fixtures. As will be appreciated by those skilled in the art, the ultimate outlet of pressurized air at the fixtures will represent the least restrictive path for pressurized air. In other words, by known fluid dynamics, the designer can encourage the pressurized air from the output of the blower to move with the least airflow resistance to an outlet at the fixtures so to minimize losses or leakiness. As such, U.S. patent application Ser. Nos. 12/626,095 and 12/623,875, now U.S. Pat. No. 8,651,704, both of which are incorporated by reference herein and commonly owned by the assignee of the present application, may be referenced for details regarding how airflow from a pressurized air source can be effectively directed to an LED or solid-state light source fixture for effecting cooling during operation. U.S. patent application Ser. Nos. 12/626,095 and 12/623,875, now U.S. Pat. No. 8,651,704, provide a variety of different embodiments; some direct air from an airflow pathway directly onto the LED fixture heat sink. Others are directed into a housing around the heat sink. The aforementioned references are intended to provide several examples of a feature the figures and description herein illustrate; namely, that the elevating structure itself can originally and naturally have a continuous internal pathway which can be used for or converted into an air duct from a pressurized air source such as blower 20 up through the elevating structure to the fixtures of a lighting system. Airflow from the blower travels up through the pole and escapes out opening 50 and is directed by tubes 80 to individual fixtures 40 (see FIG. 3B). As can be appreciated, tubes 80 can be of any number of materials and configurations. Ideal examples would be materials that could withstand outdoor environmental conditions for decades (e.g., 24 gauge galvanized pipe). Other examples might include a number of UV-stable thermal plastics. Another suitable material could comprise a metal flexible hose such as available from Air Handling Systems, Woodbridge, Conn., USA; such tubing has some flexibility to allow for thermal expansion and contraction and some relative movement between fixtures and their cross arm 60 or pole 15. The terminal outlet end of said tubing could have a fitting (e.g., such as also available from Air Handling Systems) or could simply have an open end. Air could be simply outlet from that open end or there could be some sort of distribution fitting like a manifold also available from Air Handling Systems, Woodbridge, Conn. Openings 30 and 50 (see FIGS. 2 and 3B, respectively) may be tightly sealed to the blower and air ducts, or may allow for some air leakage as long as air flow is sufficient to provide cooling to the fixtures.

According to the present embodiment, air flow may be directed to the heat sinks of LED lights contained in fixtures 40, or to the bases or envelopes of other types of lighting elements that may be contained in fixtures 40. Alternatively, air may be directed into cross arm 60, and through mounting knuckles 70 (see FIG. 3A). From there air may be directed to LED heat sinks or bases or envelopes of other types of lighting elements. In this embodiment, cross arms 60 have a 6 foot span, a tubular interior constant cross-sectional area of approximately 6 square inches, and a volume of approximately 4400 cubic inches, and are available from Musco Sports Lighting. Mounting knuckles 70 could be like those described in published U.S. patent application 2011/0149582, incorporated by reference herein and commonly owned by the assignee of the present application. Such knuckles are intentionally made to mount underneath cross arm 60 where there would be an opening into a first half of knuckle 70 with an air path that would extend to a second half attached to a fixture 40. An air path would extend all the way through knuckle 70 even though there is a pivotable joint between the two halves. An opening into the back of fixture 40 would then provide a complete air pathway from cross arm 60 to the interior of fixture 40. Air could then leave through ventilation openings in 40 such that airflow would be encouraged from blower 20 through the hollow interior of pole 15, the hollow interior of cross arm 60, through knuckle 70, and into each fixture 40, at an air speed and volume per unit time to effectuate a percent lumen increase on the level desired or needed for a given design. Of course the designer would likely take into account how many fixtures were installed on each pole 15 (in this example, there could be many or just a few) when calculating a necessary air speed and volume.

A blower that could be used to provide airflow is the Peerless ⅓ HP Pressure Blower PW-8, which operates at 3500 RPM and delivers 256 CFM at 1 inch static pressure, available from Global Equipment Company, Port Washington, N.Y., USA. But as previously mentioned, the type and output of the component which produces the pressurized air source or airflow can vary according to need and desire. Ideally, the component would be suitable for use in outside environments for decades. Said component could utilize the same electric power source that is used to power the light fixtures. Optionally, the blower could be enclosed by some covering or housing.

Figure 3A:
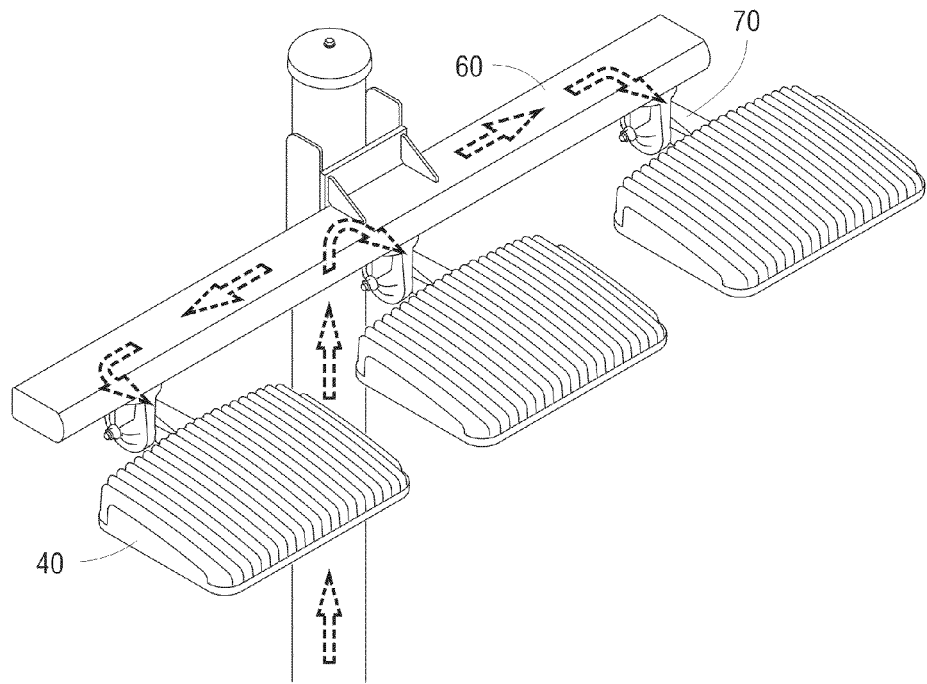
Figure 3B:
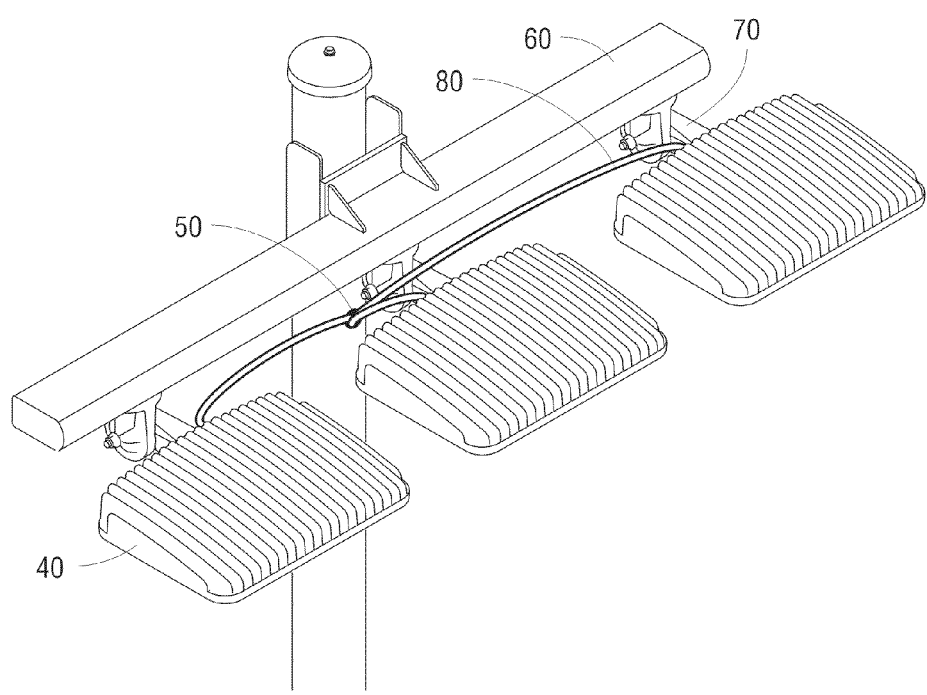

FIG. 2 illustrates a larger view of the blower installation. As can be appreciated, blower 20 can have its own mount or no mount (and just rely upon some mounting interface to the side of pole 15). Alternatively, blower 20 might be mounted on other pole-mounted components. For example, it might be mounted on top of an electrical enclosure box 35, FIG. 1 above ground level but well below fixture level, as are conventional on many light poles. FIGS. 3A-B illustrate a larger view of the components at the top of the pole. FIG. 3B shows supply of airflow via tubes 80 directly from pole 15. FIG. 3A shows in dashed line arrows the flow path from pole 15 into the interior of cross arm 60 and then through a continuous air pathway through mounting knuckles 70 to fixtures 40. As can be appreciated, there could be more fixed or rigid air conduits instead of hoses or instead of using the existing structure of pole, cross arm, and knuckles. For example, there could be rigid metal air ducts from pole 15 or cross arm 60 to fixture 40.

However, in the embodiments in FIGS. 3A and 3B, the routing of air via tubes 80 or directly through the mounting structures allows freedom of adjustment of fixtures 40 relative cross arm 60 without requiring customized conduits for airflow.

C. Exemplary Method and Apparatus Embodiment 2

FIG. 4 illustrates a second embodiment having a pole 15, blower 20, opening 30, and LED fixture with heat sink 90. Arrows 25 indicate airflow through the pole and fixture. As is illustrated in FIG. 4, airflow through pole 15, and then across a mounting interface 45 (e.g., as may be appropriate for a non-adjustable or static mounting situation), can provide a direct, continuous air path to the inside of a fixture and the proximate edge of heat sink 90. That air can be directed through and across heat sink 90 and out some type of vent at the distal edge of heat sink 90 so to provide an exhaust for the airflow. U.S. patent application Ser. Nos. 12/626,095 and 12/623,875, now U.S. Pat. No. 8,651,704, provide some examples of airflow paths.

D. Options & Alternatives

As can be appreciated, the foregoing detailed description gives but a few examples of apparatus and methods according to the present invention. Variations obvious to those skilled in the art will be included within the invention.

It will also be appreciated that the discoveries of the inventor also engender methodologies that can be useful for design and installation of LED lighting systems.

Figure 5:
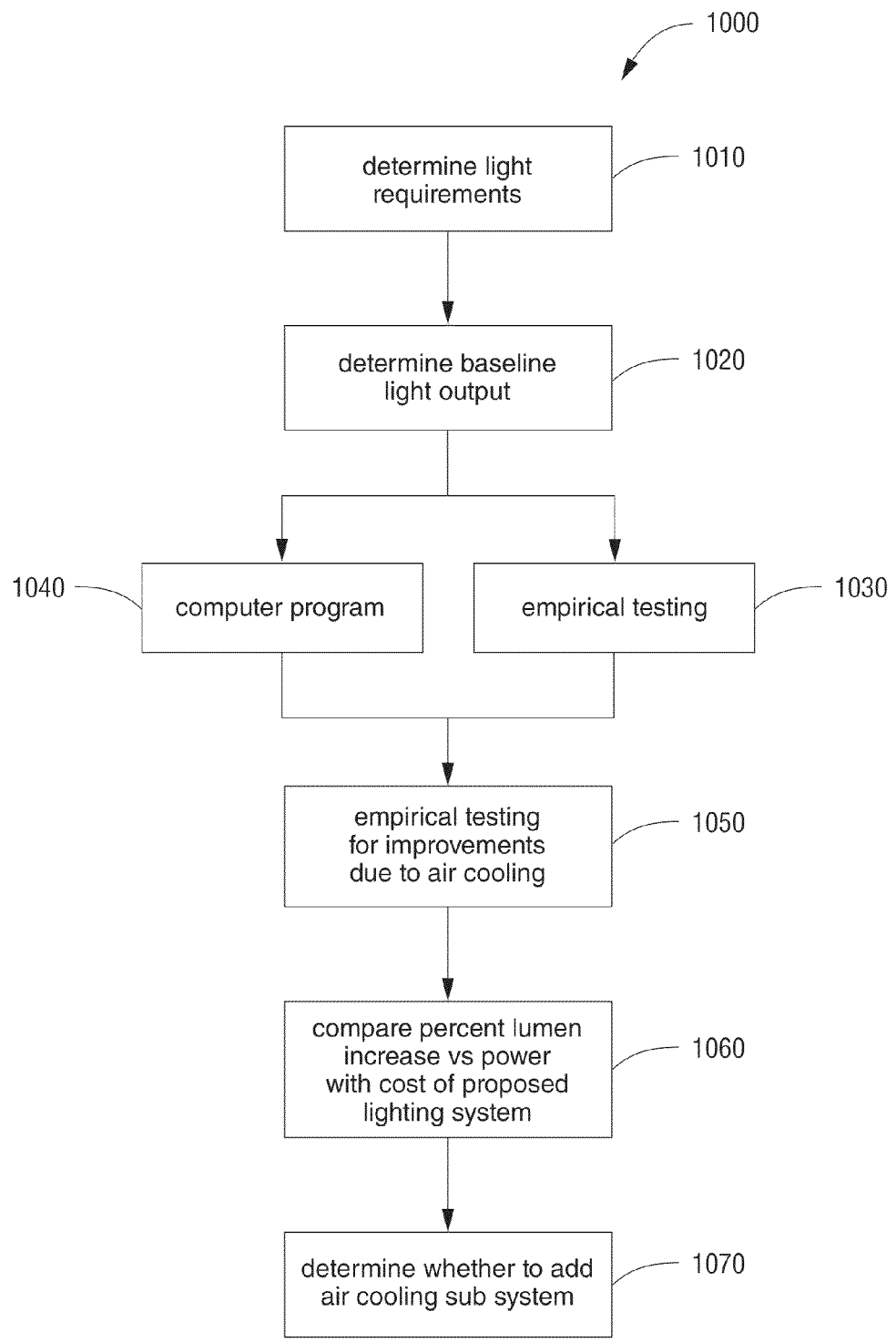
FIG. 5 illustrates a method for design and installation of LED lighting systems according to aspects of the invention.

One method may generally be described according to process 1000 illustrated in FIG. 5. As indicated above, a method can include as a first step (reference no. 1010), deriving by methods known in the art a desired or required light level and uniformity for a target area. As a second step (reference no. 1020), the designer can then utilize computer programs (reference no. 1040) such as are routinely used in the industry and by manufacturers, or empirical testing (reference no. 1030) of LED fixtures that are candidates for the installation, to determine a baseline light output when a fixture is operated normally without any auxiliary air cooling. Then it can be determined, via empirical testing (reference no. 1050), how such candidate fixtures would react to air cooling during operation (e.g., as in Table 1). Having these data, a comparison (reference no. 1060) of estimated (or measured) percent lumen increase at a given power level (i.e., efficacy increase) can be made to the capital cost and operating cost of candidate air cooling systems. The designer, either alone or with an end user or customer, can then determine (reference no. 1070) whether a given candidate air cooling sub-system should be added. Some variables that may affect whether or not to add a cooling sub-system include, but are not limited to: different airflow volume and speed at the fixtures, where/how many air pathways exist, cost of electrical power to operate the LEDs and the air cooling system, whether or not the LEDs would be overdriven or under-driven relative to recommended or rated operating wattage by the manufacturer of the LEDs, and whether or not the number of LED fixtures can be reduced for an installation (which could reduce capital and operating costs) and/or eliminating a whole pole or elevating structure with a number of fixtures because of the cumulative increase in light output from other poles and fixture arrays with the cooling system.

What is claimed is:

1. A method of increasing efficacy of a light-emitting diode (LED) wide-area lighting system comprising:
   a. elevating one or more LED fixtures on an elevating structure;
   b. mounting a source of pressurized air at or near the elevating structure and below the lighting fixtures;
   c. providing an airflow pathway between the source of pressurized air and one or more of the elevated LED fixtures; and
   d. distributing air at a predefined flow rate to said one or more fixtures from the pressurized source through the pathway so to produce a cooling effect, wherein said cooling effect is correlated to an increase in efficacy.

2. The method of claim 1 wherein the elevating structure includes a substantially continuous airflow pathway.

3. The method of claim 1 wherein the elevating structure comprises a hollowed pole and wherein the airflow pathway includes the hollowed pole.

4. The method of claim 3 wherein the pole is tubular.

5. The method of claim 3 wherein the pole comprises plural sections that are slip-fit together.

6. The method of claim 1 wherein the source of pressurized air comprises a blower that takes ambient air as an input and increases its speed for a directed output.

7. The method of claim 1 wherein the lighting system comprises plural elevating structures, each with plural LED fixtures.

8. The method of claim 3 wherein the airflow pathway further comprises one or more ducts operatively connecting the pole and the one or more fixtures.

9. The method of claim 8 wherein the one or more ducts are flexible and of a smaller diameter than the hollow of the pole.

10. The method of claim 3 further comprising a hollowed cross arm operatively connecting the hollowed pole and the one or more fixtures, and wherein the pathway includes the hollowed cross arm.

11. The method of claim 10 further comprising one or more mounting knuckles, each mounting knuckle operatively connecting the cross arm and a fixture, the mounting knuckle including an internal airflow pathway, and wherein the pathway includes the mounting knuckles.

12. The method of claim 1 wherein the air is directed to inside each fixture and along at least a substantial portion of a heat sink for each fixture.

13. The method of claim 1 wherein the correlation between cooling and efficacy is based on testing.

14. The method of claim 1 wherein the correlation between cooling and efficacy is based, at least in part, on data from the LED manufacturer.

15. The method of claim 1 further comprising:
   a. measuring efficacy; and
   b. if the measurement does not meet a threshold, adjusting the flow rate.

16. A system for high intensity lighting comprising:
   a. an elevating structure having an internal void;
   b. one or more high intensity lighting fixture assemblies each comprising:
      i. a mounting interface mounted to the elevating structure;
      ii. one or more lighting fixtures mounted to the mounting interface, each lighting fixture comprising
         1. a housing;
         2. one or more high intensity LED light sources mounted in the housing;
   c. a source of air flow in fluid communication with and using at least a portion of the internal void of the elevating structure as a substantially enclosed primary air flow pathway to an outlet at or near the lighting fixture assemblies;

d. a secondary air flow pathway in fluid communication between the outlet of the primary air flow pathway and at or through each lighting fixture;

e. so that a flow of air can be delivered to the lighting fixtures during operation.

17. The system of claim 16 wherein the mounting interface comprises a cross arm and attachment member to the elevating structure and the mounting interface has an internal void that comprises a part of the secondary air flow pathway.

18. The system of claim 16 wherein the secondary air flow pathway comprises independent flexible tubing between the primary air flow pathway and the fixtures.

19. A method of operating high intensity lights comprising:

a. elevating one or more high intensity lights on elevating structure having an internal void;

b. operating the high intensity lights;

c. supplying an air flow to or across the lights from a source of air flow in fluid communication with the internal void of the elevating structure.

20. A method of designing a high intensity lighting system including a plurality of light fixtures elevated on elevating structures for a target area comprising:

a. determining lighting intensity and uniformity requirements for the target area;

b. determining the type, placement, and operating characteristics of lighting fixtures and elevating structures to meet or exceed the intensity and uniformity requirements;

c. determining capital and operating costs to install the designed lighting fixtures and elevating structures at the target area;

d. determining any potential improvement in efficacy for the lighting fixtures for at least one rate of generated air flow at, by, or near the lighting fixtures during operation;

e. determining capital and operating costs for generating said air flow; and f. deciding if the generated air flow should be added to the lighting system.

21. The method of claim 20 wherein the deciding step includes determining if addition of the generated air flow allows reduction in capital or operating costs for the lighting system.

22. The method of claim 21 wherein reduction of capital or operating costs comprises reducing one or more of:

a. number of light fixtures;

b. number of elevating structures; and c. energy consumption by the light fixtures.

23. The method of 20 wherein the elevating structures originally include a void which can comprise a primary generated air flow path.

24. The method of claim 21 wherein capital and operating costs of the generated air flow can include one or more of:

a. an air flow generation system;

b. energy consumption for the air flow generation system.

\* \* \* \* \*